(12) United States Patent
Luong

(10) Patent No.: US 9,360,512 B2
(45) Date of Patent: Jun. 7, 2016

(54) METHOD OF CAPACITIVE MEASUREMENT BY NON-REGULAR ELECTRODES, AND APPARATUS IMPLEMENTING SUCH A METHOD

(71) Applicant: QUICKSTEP TECHNOLOGIES LLC, Wilmington, DE (US)

(72) Inventor: Bruno Luong, Nimes (FR)

(73) Assignee: QUICKSTEP TECHNOLOGIES LLC, Wilmington, DE (US)

( * ) Notice: Subject to any disclaimer, the term of this patent is extended or adjusted under 35 U.S.C. 154(b) by 0 days.

(21) Appl. No.: 14/347,070

(22) PCT Filed: Mar. 8, 2013

(86) PCT No.: PCT/EP2013/054729
§ 371 (c)(1),
(2) Date: Mar. 25, 2014

(87) PCT Pub. No.: WO2013/135575
PCT Pub. Date: Sep. 19, 2013

(65) Prior Publication Data
US 2014/0379287 A1 Dec. 25, 2014

(30) Foreign Application Priority Data
Mar. 13, 2012 (FR) ...................... 12 52271

(51) Int. Cl.
*G01R 25/00* (2006.01)
*G01R 27/26* (2006.01)
*G06F 3/041* (2006.01)
*G06F 3/044* (2006.01)
*G01R 35/00* (2006.01)

(52) U.S. Cl.
CPC .......... *G01R 27/2605* (2013.01); *G01R 35/005* (2013.01); *G06F 3/044* (2013.01); *G06F 3/0418* (2013.01)

(58) Field of Classification Search
None
See application file for complete search history.

(56) References Cited

U.S. PATENT DOCUMENTS

| 6,348,862 | B1 | 2/2002 | McDonnell |
| 2003/0132922 | A1 | 7/2003 | Philipp |
| 2010/0013800 | A1 | 1/2010 | Elias |
| 2012/0013354 | A1* | 1/2012 | Bowler et al. .................. 324/664 |

FOREIGN PATENT DOCUMENTS

| WO | 2004/023067 | 3/2004 |
| WO | 2011/015795 | 2/2011 |

* cited by examiner

*Primary Examiner* — Aditya Bhat
(74) *Attorney, Agent, or Firm* — Morrison & Foerster LLP

(57) ABSTRACT

A method for providing corrected measurements of absolute capacitance of an object in the proximity of at least two independent electrodes of a non-optimized shape integrated in a human-machine interface device for detecting the object. The method includes measuring, for each electrode, an actual value of absolute capacitance between the electrode and the object, and calculating a prediction by applying a multi-variable nonlinear prediction model to the actual values of absolute capacitance so as to obtain an image of probability densities. Then, using the probability densities as corrected absolute capacitance values for detecting the object.

25 Claims, 5 Drawing Sheets

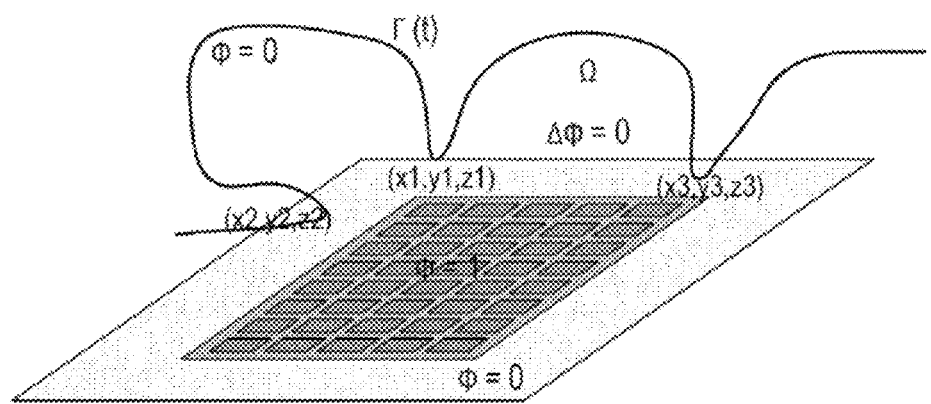
FIGURE 2
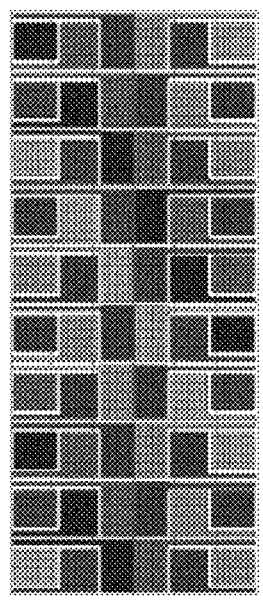
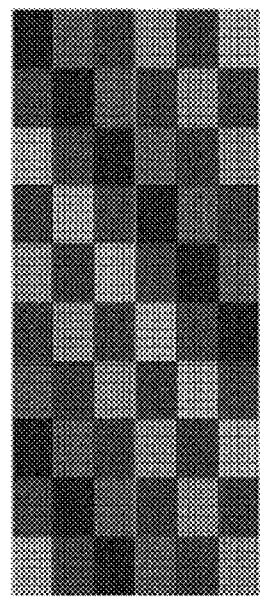
FIGURE 3a  FIGURE 3b

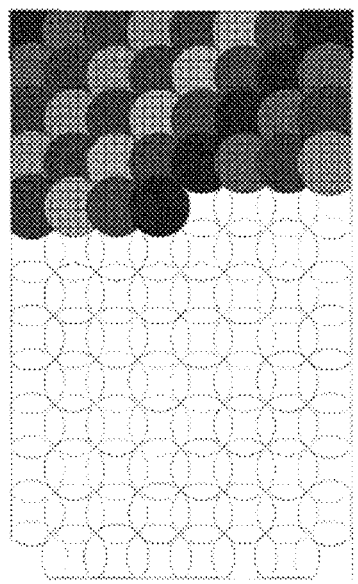
FIGURE 4
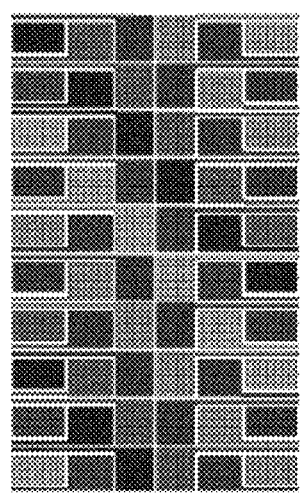 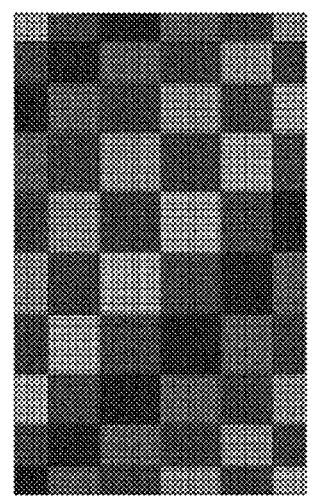
FIGURE 5a            FIGURE 5b

METHOD OF CAPACITIVE MEASUREMENT BY NON-REGULAR ELECTRODES, AND APPARATUS IMPLEMENTING SUCH A METHOD

BACKGROUND

The present invention relates to a method of measurement of absolute capacitance (self-capacitance) of an object in the proximity of a plurality of independent electrodes, these electrodes having non-regular surfaces. It also relates to an electronic gestural interface device implementing the method.

The field of the invention is more particularly, but non-limitatively, that of touch-sensitive and 3D capacitive surfaces used for human-machine interface commands.

Communication and work devices are increasingly using a touch-sensitive control interface such as a pad or a screen. It is possible for example to mention mobile telephones, smartphones, computers with touch-sensitive screens, pads, PCs, mouse devices, touch pads, widescreens, etc.

A large number of these interfaces use capacitive technologies.

The touch-sensitive surface is equipped with conductive electrodes connected to electronic means which make it possible to measure the variation of the capacitances appearing between electrodes and the object to be detected in order to give a command.

The capacitive techniques currently used in touch-sensitive interfaces most often use two layers of conductive electrodes in the form of rows and columns. The most widely used geometric topology is that each row and each column is composed of rhombuses which are connected together in the vertical direction to form a column and in the horizontal direction to form a row.

Two operating modes can be produced using this geometric topology for detecting the presence of an object in front of the surface:

1. The electronics measure the coupling capacitances which exist between these rows and columns. When a finger is very close to the active surface, the coupling capacitances in the proximity of the finger are modified and the electronics can thus locate the position in 2D (XY), in the plane of the active surface. These technologies make it possible to detect the presence and the position of the finger through a dielectric. They have the advantage of allowing a very good resolution in the location of one or more fingers in the plane (XY) of the sensitive surface. These techniques have however the drawback of generating in principle large leakage capacitances at the level of the electrodes and of the electronics. These leakage capacitances can moreover drift over time due to ageing, the deformation of the materials or the effect of the variation of the environmental temperature. These variations can degrade the sensitivity of the electrodes, or can even trigger commands in an untimely manner. Another drawback of this technique is that the electric field generated between the rows and the columns remains especially concentrated around the surface and the change of coupling capacitance does take place only for objects very close to the surface, or even in contact. This limits this technique to touch and 2D use exclusively.

2. The electronics measure—for each row and each column of electrodes—the absolute capacitance which appears between the object and the electrode in question. The advantage of this method is that the electric field is radiated further from the surface, making it possible to measure objects which are located several centimeters above the screen. The drawback of this method is the limitation of detecting several objects because of a positional ambiguity of two objects, in fact if the X or Y coordinates of these objects are permuted, the capacitances measured will be identical. For a person skilled in the art, this phenomenon is known as "ghosting".

Techniques are also known that make it possible to measure the absolute capacitance which appears between electrodes and an object to be detected. For example, document FR 2 844 349 by Rozière is known, which discloses a capacitive proximity detector comprising a plurality of electrodes which will be independently excited and measured. This detector makes it possible to measure the absolute capacitance and the distance between the electrodes and the objects in the proximity.

These techniques make it possible to obtain measurements of capacitance between the electrodes and the objects with high resolution and high sensitivity. This makes it possible to detect for example a finger at a distance of several centimeters without ambiguity. The detection can be done in three-dimensional space (XYZ) but also on a surface, in a plane (XY). These techniques offer the possibility of developing truly contactless gestural interfaces and also make it possible to improve the performance of touch-sensitive interfaces.

In order to interpret the measurements easily, to detect the presence of an object reliably and to estimate its position accurately, the electrodes are ideally disposed regularly on the surface, which preferably results in disposing the electrodes in a configuration having identical rectangular geometry for all of the electrodes. The size of the electrodes is approximately identical to or smaller by about 50% than the size of the object to be detected. Typically, an electrode surface area ranging from 0.35 to 0.65 $cm^2$ is well suited to an application of the human interface type, where the object to be detected is a human finger. This type of regular partitioning is well suited to interfaces of the virtual 2D/3D button type where the electrodes are etched on an electronic printed circuit board (PCB) and are supplied by a power supply which is located below the conductive surface layer.

However, because of the constraints related to the transparency of the surfaces in certain applications of the "smartphone" type, where the detection surface must allow the passage of a maximum amount of light coming from the display, the surface of the electrodes and its electrical connection to the electronic excitation and acquisition circuit are disposed on the same layer. The electrical connections make it possible to connect the electrodes located at the centre of the screen to the periphery of the screen and then these connections descend, if this is necessary, along the circumference of the screen. The connections on the circumference can be protected or not protected from the capacitive interference of the environment by covering them with an isolating surface and then by disposing a conductor nearby, known as a guard conductor, which is excited with the same electrical potential as that of the electrodes. If the tracks are "guarded", they are considered as non-measuring and are not considered as part of the capacitive measurements. In the opposite case, these tracks are an integral part of the measurement. The connections which connect the central electrodes to the periphery result in each individual measurement no longer being localized in a rectangular surface. It measures a response not only when the object is above the principal surface, but as soon as the object is in the proximity of the connection track which can be at a distance from the principal measuring surface.

However, the constraint of better transparency of the screen makes it necessary to dispose the electrodes and their connections on the same surface. This makes it possible to reduce the manufacturing cost. This simplification makes it possible to have great reliability by eliminating the inter-layer connection elements.

SUMMARY

The objective of the present invention is a new measuring method limiting the interference due to the connection tracks.

Another objective of the invention is to reduce the cost of the design of a device comprising a gestural human-machine interface.

At least one of the objectives is achieved with a method of measuring the absolute capacitance of an object with respect to at least two independent electrodes integrated in a human-machine interface device for the detection of said object. According to the invention, this method comprises the following steps:

a) for each electrode, a value of absolute capacitance between the electrode and the object is measured, a') a prediction is made by applying a multi-variable nonlinear prediction model to the actual values of absolute capacitance so as to obtain an image of probability densities (at the time of the measurement, in real time) these probability densities being considered as corrected absolute capacitance values that are used for the detection of said object.

With such a method according to the invention, a multi-variable nonlinear prediction model is used for correcting the actual absolute capacitance values. This correction makes it possible to transform these actual values into corrected values making it possible to compensate for various defects in the design of the electrodes. These defects can be due to a non-optimized geometric shape of the electrodes which would limit in particular the resolution of the detection. For example, this geometric shape can be due to connection tracks which leave from the periphery of a plane of electrodes and go to electrodes disposed in the central area of the plane of electrodes. This unfavourable geometric shape can be described as a non-regular surface. By "non-regular surface" is meant a surface which does not have a regular geometric shape such as a square, a rectangle, a circle or any other shape. By way of example, such a surface is a surface which comprises a rectangle adjoining a thin strip such as a connection track.

As will be seen below, the image of probability densities can be an image of virtual values obtained by measurement on an ideal plane of electrodes or an image of functions obtained from a Gaussian distribution for an ideal plane of electrodes. This ideal plane of electrodes can be a theoretical design for a high-resolution arrangement of the electrodes, with a number and shape of the electrodes different from the number and shape of the actual electrodes.

Preferably, the multi-variable nonlinear prediction model is obtained by nonlinear regression on the basis:

of actual values of absolute capacitance obtained for a plurality of object positions with respect to said at least two electrodes, and of an image of probability densities obtained for a plurality of object positions with respect to idealized electrodes.

The determination by nonlinear regression can be obtained by an artificial neural networks model. Different ways of using neural networks exist and are known to a person skilled in the art.

Preferably, the present invention provides for the following implementation: in step a) a vector $V_{raw}$ is constituted from the measured absolute capacitance values and the prediction in step a') comprises the following steps:

b) application of a first nonlinear transformation F2 to at least the vector $V_{raw}$ in order to obtain a vector X2, c) application of an affine transformation in order to obtain a vector Y2 by multiplying the vector X2 by a matrix M2 and adding a translation vector Y02; the matrix M2 being a matrix of transfer between a vector of actual values of absolute capacitance obtained on electrodes of non-regular surface in the presence of an object and a vector of virtual values obtained for idealized electrodes in the presence of an object, d) application to at least the vector Y2 of a second nonlinear transformation which is inverse to the first nonlinear transformation F2 in order to obtain a correction vector V_corr, and e) use of the correction vector V_corr as values of absolute capacitance for the detection of said object.

With this implementation, a correction of the measured values of absolute capacitance is carried out. These values have been modified in order to eliminate in particular the influence of the connection tracks, these connection tracks being the difference between the actual electrodes and the virtual electrodes. It is by means of the matrix M2 and the translation vector Y02 that the model is used between the actual electrodes and the virtual electrodes considered as ideal.

The object which moves in a volume in front of or close to the electrodes can be detected accurately thanks to the method according to the invention. This makes it possible to easily envisage the design of a matrix array of electrodes disposed on the same layer as the connections.

According to an advantageous feature of the invention, different functions F2 can be used, such as for example:

$F2(V_{raw})=1/V_{raw}$ $F2(V_{raw})=1/(V_{raw}/Vmax+\beta)$, Vmax being a predetermined maximum voltage, and $\beta$ being a positive number; or $F2(V_{raw})=V_{raw}/Vmax$, Vmax being a predetermined maximum voltage.

According to an advantageous embodiment of the invention, after step a), the following steps are carried out:

filtering of the values of the vector $V_{raw}$ in order to obtain a vector $V_{inf\_raw}$ application of a nonlinear transformation F1 to the vector $V_{inf\_raw}$ in order to obtain a vector X1, application of an affine transformation in order to obtain a vector Y1 by multiplying the vector X1 by a matrix M1 and by adding a translation vector Y01; the matrix M1 being a matrix of transfer between a vector of actual values of absolute capacitance obtained on electrodes of non-regular surface in the absence of an object of detection, and a vector of virtual values in the absence of an object of detection, and application to the vector Y1 of a nonlinear transformation which is inverse to the nonlinear transformation F1 in order to obtain a correction vector Vinf_corr, then carrying out steps b) to e) in which, in step b), the nonlinear transformation F2 is applied to the vectors $V_{raw}$ and $V_{inf\_raw}$ in order to obtain a vector X2 that is a function of $V_{raw}$ and $V_{inf\_raw}$; and in step d) a second nonlinear transformation, which is inverse to the first nonlinear transformation F2, is applied to the vectors Y2 and Vinf_corr in order to obtain a correction vector V_corr which is a function of Y2 and Vinf_corr.

With such an embodiment, there is firstly corrected a set of values relating to the actual electrodes without taking account of the object of interest, it being the filtering that makes it possible to eliminate the influence of the object of interest.

The second correction uses the results of the first correction to correct the values relating to the actual electrodes taking the object of interest into account.

According to the invention, the function F1 can also have different forms such as:

$F1(V_{raw})=1/V_{raw}$.

$F1(V_{raw})=1/(V_{raw}/Vmax+\beta)$, Vmax being a predetermined maximum voltage, and $\beta$ being a positive number, or $F1(V_{raw})=V_{raw}/Vmax$, Vmax being a predetermined maximum voltage.

In this embodiment, the function F2 can be such that:

$F2(V_{raw}, V_{inf^*})=V_{raw}/V_{inf^*}$; $V_{inf^*}$ being equal to $V_{inf\_raw}$ during the nonlinear transformation in step b), and equal to Vinf_corr during the inverse nonlinear transformation in step d), or $F2(V_{raw}, V_{inf^*})=1-(V_{raw}/V_{inf^*})$; $V_{inf^*}$ being equal to $V_{inf\_raw}$ during the nonlinear transformation in step b), and equal to Vinf_corr during the inverse nonlinear transformation in step d).

During step e), a step of normalization of the correction vector V_corr can also be envisaged, during which the following steps are carried out:

filtering the correction vector V_corr in order to obtain a filtered vector V_corr_f, and normalizing the correction vector with the filtered vector V_corr_f in order to obtain a normalized vector V_corr_nor.

According to an advantageous feature of the invention, the filtering is obtained according to one of the following formulae:

$V(t0)=\max\{V(t): t \in (-\infty, t0)\}$; t0 being the time of the measurement, $V(t)$ being the vector to which the filtering is applied, $t$ being the time index, or $V(t0)=\max\{V(t): t \in (t0-\text{windowsize}, t0)\}$, where windowsize is a time period of the auto-calibration window—i.e. the time period in which any unchanged interference will be considered as caused by an object of no interest—t0 being the time of the measurement, V(t) being the vector to which the filtering is applied, t being the time index.

The filtering can also be obtained simply by replacing the vector to which the filtering is applied by a predetermined vector.

According to the invention, the matrix M can be obtained by the method of partial least squares, the vector of virtual values being a vector of values obtained for idealized electrodes. These are regular electrodes having no connection track at a distance.

In another way, provision can be made for obtaining the matrix M from a sampling of a probability density function resulting from a multitude of exact object positions with respect to the electrodes, the vector of virtual values being a vector the values of which are probabilities of presence. In this case, the probability density function can advantageously be a 2D Gaussian distribution centred on each horizontal object position, the width of which depends on the vertical position of the object, this Gaussian distribution being defined by the following formula:

$Gj(t)=A(z0)*\exp[-((xj-xo)^2+(yj-yo)^2)/\sigma(zo)^2]$, where: (xj,yj) are coordinates of a regular grid on a detection surface comprising the electrodes; (xo(t),yo(t),zo(t)) are 3D coordinates of the end of the object closest to the detection surface; A(zo) and σ(zo) are two predetermined functions depending on the distance z0 in a monotonic manner, A(z) being decreasing and σ(zo) increasing.

According to another aspect of the invention, an electronic device is provided, comprising:

two independent electrodes integrated in a human-machine interface device a processing unit for detecting the position of an object by measuring the absolute capacitance of said object with respect to the electrodes. According to the invention, the processing unit is configured to implement at least one of the steps described above.

The device can comprise a touch-sensitive screen or not.

In general, the detection can be a two-dimensional detection on a screen or a gestural detection in a three-dimensional volume in the proximity of a screen or not (for example a detection pad disposed behind a wooden panel, etc.).

An embodiment of the electronics of the present invention can be the one described by patent WO 2011/015795 A1. In this embodiment, an active guard has been positioned in order to minimize the capacitive leakage and to provide better quality of measurement of objects of interest. If the active guard is not provided, the capacitive leakage should be calibrated and deducted.

The electrodes are preferably designed on the basis of tin-doped indium oxide (ITO). Other materials transparent to light such as aluminium-doped zinc oxide (AZO) or tin-doped cadmium oxide can also be used.

BRIEF DESCRIPTION OF THE DRAWINGS

Other advantages and characteristics of the invention will become apparent on examination of the detailed description of an embodiment which is in no way limitative, and the attached diagrams, in which:

FIG. 2 is a diagrammatic view illustrating the variation of the electrical potential as a function of the movement of an object of interest above a device according to the invention;

FIGS. 3a and 3b are diagrammatic views illustrating, on the one hand, actual electrodes with a non-regular division and, on the other hand, virtual electrodes with a regular division of the surface;

FIG. 4 is a diagrammatic view illustrating circular virtual electrodes;

FIGS. 5a and 5b are diagrammatic views illustrating, on the one hand, actual electrodes with a non-regular division and, on the other hand, virtual electrodes with a regular division of the surface but with a higher concentration of electrodes towards the edges;

DETAILED DESCRIPTION

Figure 1A:
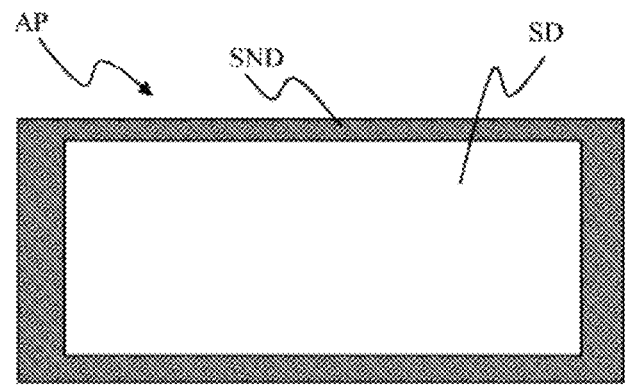
FIGS. 1a and 1b are diagrammatic views of a device according to the invention.
Figure 1B:
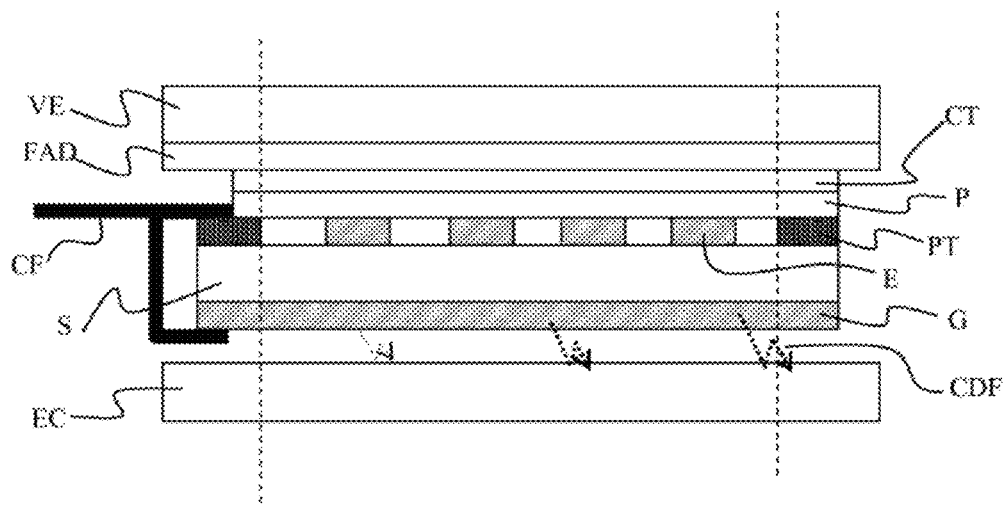

In general, in FIGS. 1a and 1b, a device AP according to the invention can be seen. It can be a telephone of the "smartphone" type or a digital tablet provided with a touch-sensitive screen. This device AP comprises a detection surface SD which is the touch-sensitive part under which in particular a plane (flat or curved) of electrodes is located. This detection surface SD comprises, starting from its top part, several layers made of transparent material such as for example:
- an outer window VE,
- an anti-debris film FAD,
- a transparent adhesive CT, and
- a polarizer P,
- electrodes E made of transparent material such as tin-doped indium oxide (ITO),
- a glass support S for electrodes,
- a guard G which is a layer made of transparent conductive material such as tin-doped indium oxide (ITO), and
- a display screen EC which must be visible from the outside through the outer window VE.

The electrodes and the guard are therefore located under the detection surface and are made of a transparent conductive material which has high resistivity.

There can also be seen a non-detecting surface SND which in this case surrounds the detection surface SD. This surface is generally opaque from the outside and has no electrodes but has connection tracks PT and flexible connectors CF which are metallic and therefore have virtually zero resistivity.

Even though the invention is not limited thereto a method according to the invention will now be described in which the regression and the prediction make use of three transformations: a nonlinear transformation, a linear transformation and then a second nonlinear transformation. As previously stated, other related techniques can be used, within the family of neural networks in particular.

The present invention can be used in a first calibration step in order to determine matrices and translation vectors of an affine transformation. According to an embodiment, a model is produced between actual absolute capacitance values and virtual absolute capacitance values. By definition, the absolute capacitance $C_j(t)$ measured by each electrode with precision is mathematically proportional to the integral of the charge density on the surface Aj of this electrode, FIG. 3a illustrates such electrodes:

$$C_j(t)=\int (\partial\phi/\partial n)(t)ds, j=1,2,\ldots,N$$

where N is the number of actual electrodes, n is the vector normal to the measuring surface, $\phi$ is the electrical potential at the time t and ds is the infinitesimal element of the surface. The normal derivative $(\partial\phi/\partial n)$ is the surface charge density.

The electrical potential verifies the electrostatic equation:
- $\Delta\phi=0$ in $\Omega$, where $\Omega$ is the 3D volume representing the three-dimensional half-volume where the area of sensitivity is located,
- $\partial\phi=\Gamma(t)$ U slab, $\Gamma(t)$ is a function of the surface of the object in motion in front of the device, where the slab is the whole of the active surface to which the excitation potential is applied.

The conditions of radiations at infinity,
- $\phi=0$ on $\Gamma(t)$,
- $\phi=1$ on the surface of the slab.

FIG. 2, shows a representation of the function $\Gamma(t)$ in form of a curve progressing over a detection surface. This curve represents for example the movement of a finger above a screen. The electrical potential depends on the shape and the position of the object.

The total capacitive surface is partitioned into N electrodes. The two values 0 and 1 Volts are given by way of example. The value 0 is the potential of the earth, and 1 is the reference value of the excitation potential. It is the floating excitation value in the case of a measurement by the capacitive floating bridge technique such as described in document WO2011/015795 the content of which is inserted here by way of reference.

In parallel with the measurements $\{Cj(t)\}$ made by a true device having actual electrodes of non-regular shape, the response by a "virtual" device, which is subjected to the same electrical potential and the same electrical field as the real device, is considered. The difference is that this "virtual" device has a more regular division of the electrodes and therefore a capacitive response in the form of an image that faithfully reflects the probability density function that an object exhibits at a location. The virtual absolute capacitance $Cv_j(t)$ measured by each electrode is mathematically proportional to the integral of the charge density on the surface Bj which is an ideal surface of the electrode, i.e. a surface not having a connection track, FIG. 3b illustrating such electrodes:

$$Cv_j(t)=\int (\partial\phi/\partial n)(t)ds, j=1,2,\ldots,Nv$$

where Nv is the number of virtual electrodes, $\phi$ is the same electrical potential at the time t and ds is the infinitesimal element of surface.

The number of virtual electrodes can be identical to or greater than the number of actual electrodes. This in order to increase the detection resolution of two or more objects that are very close to each other.

To determine the model for passing from the actual to the virtual (=ideal electrodes), it is a matter of calculating $\{Cv_j(t)\}$ from $\{C_j(t)\}$ by digital means comprised in the processing unit. The function of passage from one to the other can be determined in several ways.

1. Firstly, a set of positions of the objects on the detection volume is chosen. This set must be representative in order to cover all envisageable cases of use of the device sufficiently.

2. The electrical potential over this set of positions is calculated for example by digital simulations by means of a computer. This provides a set of electrical potentials which covers the cases of use of the device.

3. Responses with the actual device $\{C_j(t)\}$ and the virtual device $\{Cv_j(t)\}$ over this set are calculated by integrating the same charge density $(\partial\phi/\partial n)$ over the respective surfaces Aj and Bj.

4. A statistical regression or model identification method makes it possible to determine the model making it possible to calculate $\{Cv_j(t)\}$ approximately as a function of $\{C_j(t)\}$.

Steps 2 and 3 above can be carried out by digital simulation or by an experimental method: a device with non-regular electrodes and another device with idealized regular electrodes measuring the same positions of the object in the set fixed in step 1. These two devices can measure the same sequence sequentially, or in a mechanically synchronized manner in order to minimize the measurement errors.

In step 4, it is possible to use a regression method such as the "Partial Least Squares" (PLS) method. The PLS method makes it possible to link the response of the actual electrodes and of the virtual electrodes with a linear model, through a $3^{rd}$ variable which is known as a latent variable. The PLS method is known as bilinear. Other model identification techniques such as the methods of least squares with Ridge regularization, or Lasso regression, etc. can be used instead of the PLS method.

FIG. 3a shows a representation of the actual electrodes. They all have an access track to one of the two lateral edges. The surfaces of these electrodes are not regular. In FIG. 3b, the virtual electrodes exhibit a partition of the measuring surface into regular rectangles; it is possible to envisage that the surfaces of the virtual electrodes have other shapes, for example overlapping disks of the same surface area. Such an embodiment is shown in FIG. 4. The fact that the shape of each electrode is a disk makes it possible to have a more isotopic response in the plane parallel with the detection surface. It is more practical to implement the response of such overlapping virtual electrodes by simulation, rather than experimentally.

In the same way as for the shape, the distribution of the virtual electrodes can be different from that of the actual electrodes. A higher concentration can be envisaged on the edges in order to better capture the shape of the probability density function on the edges of the detection surface, as can be seen in FIG. 5b; FIG. 5a being a representation of the actual electrodes. Therefore the shape and the distribution of the virtual electrodes can be different from those of the actual electrodes. It can also be envisaged to have a denser grid where higher detection accuracy is required, for example in the centre of the detection surface.

According to another embodiment, instead of using the response of the virtual electrodes $Cv_j(t)$ as a desired output response, a set of images—which does not necessarily have physical significance—can be used as a desired output. For example the image can be a sampling of the probability density function originating directly from the exact position of the object—for example a centred 2D Gaussian distribution, the horizontal position over the object, the width of the Gaussian distribution depending on the vertical position of the object.

$$Gj(t)=A(z0)*\exp[-((xj-xo)^2+(yj-yo)^2)/\sigma^2(zo)^2],$$

where: $(xj,yj)$ are coordinates of a regular grid on a detection surface comprising the electrodes; $(xo(t),yo(t),zo(t))$ are 3D coordinates of the end of the object closest to the detection surface; $A(zo)$ and $\sigma(zo)$ are two predetermined functions depending on the distance $z0$ in a monotonic manner, $A(z)$ being decreasing and $\sigma(zo)$ increasing.

According to the invention, the model making it possible to obtain the multiplication matrices and the translation vectors of an affine function can be obtained by a transformation that converts the measurements $C_j(t)$ to the outputs $Cv_j(t)\}$, or alternatively to the outputs $Gj(t)$.

The invention also comprises a phase of operation during which a user uses a device provided with a screen and a detection device. Such a device can be an intelligent telephone of the "smartphone" type shown at 1 in FIG. 6. This device 1 comprises a display screen 2 and a capacitive detection device. The latter comprises a floating bridge electronic circuit (not shown) as described in document WO2011/015795. Such an electronic circuit comprises in particular capacitive measuring electrodes and guard electrodes in order to limit the influence of parasitic capacitances that are sources of interference. In other words, the device can comprise a conductive plane used as an active guard against capacitive leakages, this conductive plane can be of floating bridge technology as described in document FR 2 844 349 by Rozière or other technologies. The device can also not have a guard. In general, a guard is a conductive plane substantially at the same potential as that of the measuring electrodes.

Figure 6:
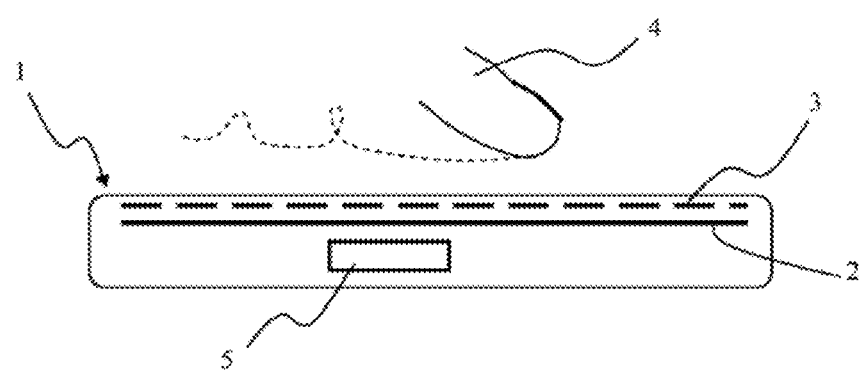
FIG. 6 is a diagrammatic view illustrating a device of the "smartphone" type according to the invention.

In FIG. 6, a matrix array of capacitive measuring electrodes 3 is disposed over a display screen 2. The capacitive electrodes 3 are made of tin-doped indium oxide (ITO).

Figure 7A:
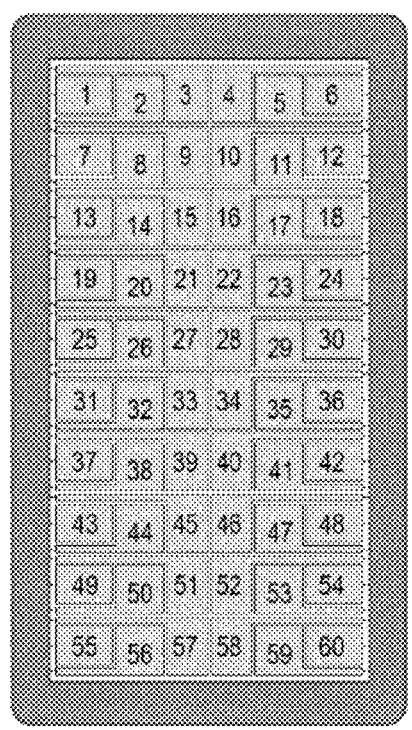
FIGS. 7a and 7b are respectively a diagrammatic view illustrating numbered actual electrodes and a diagrammatic zoom on one of the electrodes.
Figure 7B:
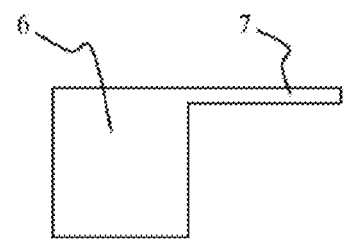

FIG. 7a shows the matrix array of the capacitive electrodes 3 which are numbered from 1 to 60. Each electrode is provided for being connected to an electronic circuit (not shown) from the left or right side peripheral of the device. As seen in FIG. 7b, each capacitive electrode comprises a working part 6, typically of rectangular shape, and a connection track 7 making it possible to connect the working part 6 to the inside periphery of the device 1. The connection tracks then descend to the inside of the device as far as the electronic circuit. The invention makes it possible to limit the influence of the connection tracks 7 so that the detected capacitance is equivalent to a capacitance that would be detected by an ideal electrode comprising only the useful part 6.

FIG. 6 shows a processing unit 5 controlling all of the components of the device 1. This processing unit can be a microprocessor or a microcontroller equipped with conventional hardware and software means for controlling in particular the display screen and the matrix array of electrodes 3. This matrix array of electrodes is designed to detect the gestures of a finger 4 in a volume above the display screen 2.

The user moves his finger 4 which is detected by the processing unit 5 by means of the matrix array of electrodes 3. The processing unit analyses these gestures in order to feed an active software application within the device, in particular via the display screen 2.

Figure 8:
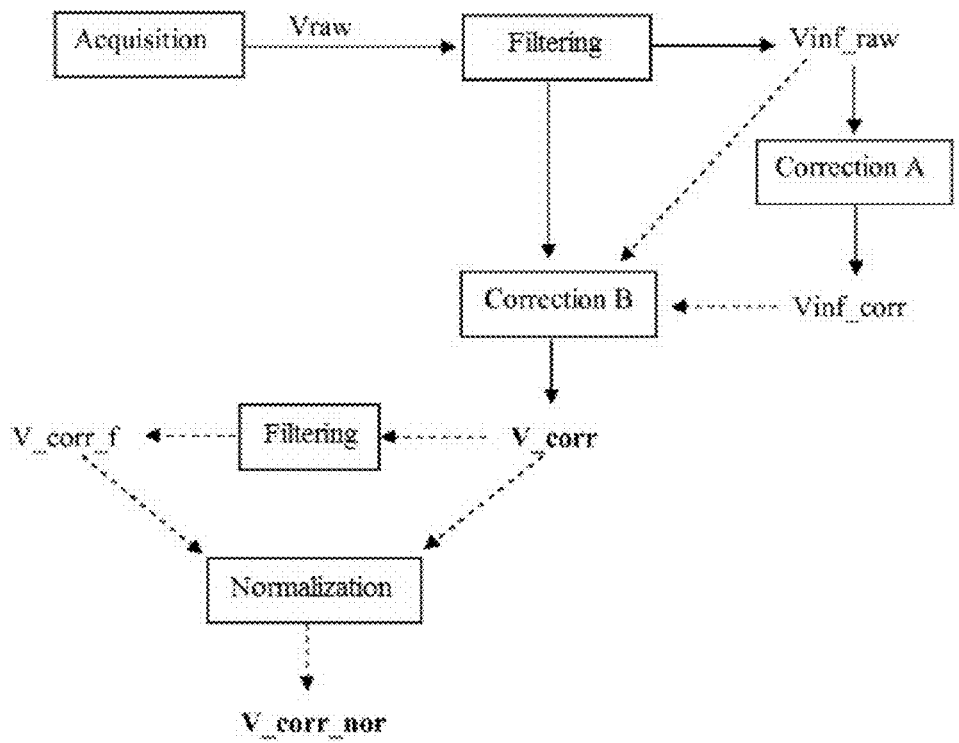
FIG. 8 is a diagrammatic view illustrating a flowchart of steps according to the invention.

In order that the detection of the finger 4 may be carried out efficiently without interference due to the connection tracks, the processing unit 5 is configured according to the invention for carrying out the operations such as described in FIG. 8.

The objective is to correct the capacitance values acquired in real time operating mode by the electrodes by using the virtual parameters obtained during the calibration.

The different operations used in operating mode by the method according to the invention as shown in FIG. 8 will now be described.

Acquisition

This is the measurement of the absolute capacitance of the matrix array of electrodes. The following are acquired: N voltages $Vraw_i=k/C_i$, where $C_i$ is the absolute capacitance measured on the actual electrode i, N is the number of electrodes and k is a gain chosen such that $\max(Vraw_i)=Vmax$ Volt, a threshold chosen previously, for example $Vmax=5$ V.

Filtering

This is a filtering operation, known as a max filter, such as described in document FR1059203. In particular, two examples of such filtering are:

$$Vinf\_raw(t0)=\max\{Vraw(t): t\in(-\infty,t0)\} \text{ or}$$

$$Vinf\_raw(t0)=\max\{Vraw(t):t\in(t0-windowsize,t0)\},$$

where windowsize is the time period of the auto-calibration window—i.e. the time period in which any unchanged interference will be considered as caused by an object of no interest, t0 the time of the measurement.

Alternatively, the max filter can be replaced by a factory calibration, which provides the values of Vinf_raw, measured in the factory and stored in a memory area.

Correction A

The natural leakage capacitances of the electrodes are corrected.

The principle of the correction is to apply three successive transformations:

a nonlinear function X1=F1(Vinf_raw) on the N voltages individually, then a linear transformation is applied on X1 using a matrix [M1] and a translation vector known as an offset vector Y01:

Y1=[M1]·X+Y01, Y01 being able to be zero; the matrix M1 and the vector Y01 being obtained from the transformation model determined during the calibration phase.

This transformation combines the actual values with each other through the matrix M1, then the inverse nonlinear transformation Vinf_corr=$F1^{-1}(Y1)$ is applied.

Several functions F1 can be used, among which are:

$F11(V) := 1/V$ $F12(V) := 1/(V/V\max + \beta)$, where $\beta > 0$, a number introduced to avoid the singularity when $V \approx 0$, $\beta = 0.1, 0.2$ or $0.3$ can be chosen for example.

$F13(V) := V/V\max$.

Correction B

Here the absolute capacitances in the presence of the object of interest in the proximity of the actual electrodes are corrected.

The principle of the previous correction is used again but with different input vectors. Three successive transformations are also applied:

a nonlinear function X2=F2(Vraw, Vinf_raw) on the N voltages individually, then a linear transformation is applied on X2 using a matrix [M2] and a translation vector known as an offset vector Y02:

Y2=[M2]·X+Y02, it being possible for Y02 to be zero; the matrix M2 and the vector Y02 being obtained from the transformation model determined during the calibration phase.

the inverse nonlinear transformation V_corr=$F2^{-1}$(Y2, Vinf_corr) is applied. The function $F2^{-1}$ is inverse to the nonlinear function F2 when the latter is considered as a function of its first parameter F2(Vraw); the second parameter Vinf_raw being considered as being fixed.

Several functions F2 can be used, among which are:

$F21(V) := 1/V$ $F22(V) := V/V\inf^*$ $F23(V) := 1 - V/V\inf^*$ $F24(V) := 1/(V/V\max + \beta)$ $F25(V) := V/V\max$.

For the calculations of the functions F22 and F23 and their inverses, Vinf*=Vinf_raw, for the direct nonlinear transformation, or Vinf_corr for the nonlinear inverse transformation.

With the functions F21, F24 and F25, it is possible of carry out the correction B directly and obtain a vector V_corr of corrected actual values.

The matrices [M1] [M2] and the offset Y1 and Y2 are estimated by a digital regression method such as for example the PLS (Partial Least Square) method from the simulation of the device having actual electrodes and a second device with virtual electrodes with a finger positioned on several locations over a volume above the device for the regression during the correction B (matrix M2 and vector Y2). In other words, M1,Y1 and M2,Y2 are different and are obtained by two PLS regressions:

(M1, Y1) on the inverse of the natural leakages of the capacitances (1/Cinf), Cinf being the natural leakage capacitance (in absence of the object of interest) of the device.

(M2, Y2) on the absolute capacitances with the object that is positioned in the detection volume.

Normalization

A max filter is used for calculating:

$V\_corr\_f(t0) = \max\{V\text{corr}(t) : t \in (-\infty, t0)\}$ or $V\_corr\_f(t0) = \max\{V\text{corr}(t) : t \in (t0 - \text{windowsize}, t0)\}$, where windowsize is the time period of the auto-calibration window, i.e. the time period in which any unchanged interference will be considered as caused by an object of no interest and t0 is the time of the measurement.

In the example described above, the nonlinear transformations A and B break down into: (1) a nonlinear transformation independent of the inputs, followed by (2) an affine transformation, followed by (3) another independent nonlinear transformation. Another possible embodiment of the transformations A and B is the artificial neurone networks model. The inputs V_raw and Vinf_raw and the outputs V_corr and Vinf_corr will be used for the learning of the network.

Alternatively, the max filter can be replaced by a factory calibration, which provides the values of V_corr_f, measured in the factory and stored in a memory area.

Then an image known as the normalization image is produced to provide a final image. This normalization depends on V_corr and V_corr_f. For example the image the values of which are the ratio of the two images V_corr and V_corr_f:

$V\_corr\_nor = V\_corr / V\_corr\_f$

The normalized image thus calculated gives a function of the probability density of the presence of the object of interest. It is used by the processing unit in order to detect the presence and the position of the object of interest (the finger) for example by calculating the expectancy of the distribution by a barycentre method, or the MODE (the value most often adopted) of the probability density function. A "spline" type interpolation can be used for a sub-pixel resolution of the MODEs (MODE: the value of a random variable that has the greatest chance of occurring, it is the location of the maximum of the probability density function).

Figure 9:
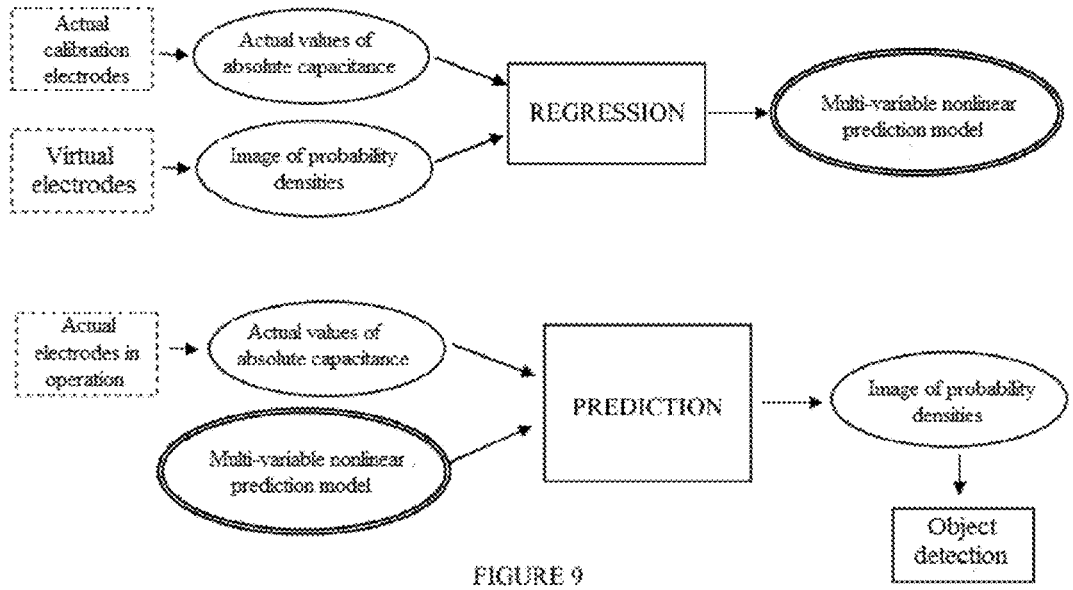
FIG. 9 is a diagrammatic view of the general method according to the invention.

In general, as seen in FIG. 9, the invention can comprise a calibration phase during which a multi-variable nonlinear prediction model is determined by carrying out a nonlinear regression on the basis:

of actual values of absolute capacitance obtained for a plurality of object positions with respect to the plane of electrodes, and of an image of probability densities obtained for a plurality of object positions with respect to a plane of idealized electrodes.

The invention then comprises a (routine) operation phase during which, at each detection, the model obtained in the calibration phase is used. In order to do this, after having carried out measurements on the electrodes, a prediction is made by applying this nonlinear multi-variable prediction model to the actual values of absolute capacitance in order to obtain a probability densities image, these probability densities being considered as corrected absolute capacitance values that are used for the detection of the object.

Preferably, the calibration is carried out just once, the model being saved in the memory of each device.

Of course, the invention is not limited to the examples which have just been described and numerous adjustments can be made to these examples without exceeding the scope of the invention.

The invention claimed is:

1. A method for providing corrected measurements of absolute capacitance of an object in the proximity of at least two independent electrodes of a non-optimized shape integrated in a human-machine interface device for the detection of said object, the method comprising:

a) measuring, for each electrode, an actual value of absolute capacitance between the electrode and the object representative of the object touching or in proximity to the interface device; and a') calculating a prediction by applying a multi-variable nonlinear prediction model to said actual values of absolute capacitance so as to obtain an image of probability densities, and using said probability densities as corrected absolute capacitance values for the detection of one or more of a location and distance of said object with respect to the interface device, wherein the corrected absolute capacitance values compensate for the non-optimized shape of the at least two independent electrodes.

2. The method according to claim 1, characterized in that the multi-variable nonlinear prediction model is obtained by nonlinear regression on the basis:
of actual values of absolute capacitance obtained for a plurality of object positions with respect to said at least two electrodes; and
of an image of probability densities obtained for a plurality of object positions with respect to idealized electrodes.

3. The method according to claim 1, characterized in that in a) a vector $V_{raw}$ is constituted from the measured absolute capacitance values and the prediction in a') comprises:
b) application of a first nonlinear transformation F2 to at least the vector $V_{raw}$ in order to obtain a vector X2;
c) application of an affine transformation in order to obtain a vector Y2 by multiplying the vector X2 by a matrix M2 and adding a translation vector Y02; the matrix M2 being a matrix of transfer between a vector of actual values of absolute capacitance obtained on electrodes of non-regular surface in the presence of an object and a vector of virtual values obtained for idealized electrodes in the presence of an object;
d) application to at least the vector Y2 of a second nonlinear transformation which is inverse to the first nonlinear transformation F2 in order to obtain a correction vector V_corr; and
e) use of the correction vector V_corr as values of absolute capacitance for the detection of said object.

4. The method according to claim 3, characterized in that the function F2 is such that $F2(V_{raw})=1/V_{raw}$.

5. The method according to claim 3, characterized in that the function F2 is such that $F2(V_{raw})=1/(V_{raw}/Vmax+\beta)$, Vmax being a predetermined maximum voltage, and $\beta$ being a positive number.

6. The method according to claim 3, characterized in that the function F2 is such that $F2(V_{raw})=V_{raw}/Vmax$, Vmax being a predetermined maximum voltage.

7. The method according to claim 3, characterized in that after a) the method further comprises:
filtering of the values of the vector $V_{raw}$ in order to obtain a vector $V_{inf\_raw}$;
application of a nonlinear transformation F1 to the vector $V_{inf\_raw}$ in order to obtain a vector X1;
application of an affine transformation in order to obtain a vector Y1 by multiplying the vector X1 by a matrix M1 and by adding a translation vector Y01; the matrix M1 being a matrix of transfer between a vector of actual values of absolute capacitance obtained on electrodes of non-regular surface in the absence of an object of detection, and a vector of virtual values in the absence of an object of detection; and
application to the vector Y1 of a nonlinear transformation which is inverse to the nonlinear transformation F1 in order to obtain a correction vector Vinf_corr;
then carrying out b) to e) in which, in b), the nonlinear transformation F2 is applied to the vectors $V_{raw}$ and $V_{inf\_raw}$ in order to obtain a vector X2 that is a function of $V_{raw}$ and $V_{inf\_raw}$; and in d) a second nonlinear transformation, which is inverse to the first nonlinear transformation F2, is applied to the vectors Y2 and Vinf_corr in order to obtain a correction vector V_corr which is a function of Y2 and Vinf_corr.

8. The method according to claim 7, characterized in that the function F1 is such that $F1(V_{raw})=1/V_{raw}$.

9. The method according to claim 7, characterized in that the function F1 is such that $F1(V_{raw})=1/V_{raw}/Vmax+\beta)$, Vmax being a predetermined maximum voltage, and $\beta$ being a positive number.

10. The method according to claim 7, characterized in that the function F1 is such that $F1(V_{raw})=V_{raw}/Vmax$, Vmax being a predetermined maximum voltage.

11. The method according to claim 7, characterized in that the function F2 is such that $F2(V_{raw}, V_{inf*})=V_{raw}/V_{inf*}$; $V_{inf*}$ being equal to $V_{inf\_raw}$ during the nonlinear transformation in b), and equal to Vinf_corr during the inverse nonlinear transformation in d).

12. The method according to claim 7, characterized in that the function F2 is such that $F2(V_{raw}, V_{inf*})=1-(V_{raw}, V_{inf*})$; $V_{inf*}$ being equal to $V_{inf\_raw}$ during the nonlinear transformation in b), and equal to Vinf_corr during the inverse nonlinear transformation in d).

13. The method according to claim 3, characterized in that e) comprises moreover a normalization of the correction vector V_corr comprising:
filtering the correction vector V_corr in order to obtain a filtered vector V_corr_f; and
normalizing the correction vector with the filtered vector V_corr_fin order to obtain a normalized vector V_corr_nor.

14. The method according to claim 7, characterized in that the filtering is obtained according to the following formula:

$V(t0)=\max\{V(t):t\in(-\infty,t0)\}$; t0 being the time of the measurement, $V(t)$ being the vector to which the filtering is applied, $t$ being the time index.

15. The method according to claim 7, characterized in that the filtering is obtained according to the following formula:

$V(t0)=\max\{V(t):t\in(t0-\text{windowsize},t0)\}$, where windowsize is a time period of the auto-calibration window, t0 being the time of the measurement, V(t) being the vector to which the filtering is applied, t being the time index.

16. The method according to claim 7, characterized in that the filtering is obtained by replacing the vector to which the filtering is applied by a predetermined vector.

17. The method according to claim 3, characterized in that the matrix M is obtained by the method of partial least squares, the vector of virtual values being a vector of values obtained for idealized electrodes.

18. The method according to claim 3, characterized in that the matrix M is obtained from a sampling of a probability density function resulting from a multitude of exact object positions with respect to the electrodes, the vector of virtual values being a vector the values of which are probabilities of presence.

19. The method according to claim 18, characterized in that the probability density function is a 2D Gaussian distribution centred on each horizontal object position, the width of which depends on the vertical position of the object, this Gaussian distribution being defined by the following formula:

$Gj(t)=A(z0)*\exp[-((xj-xo)^2+(yj-yo)^2)/\sigma(zo)^2]$, where: (xj,yj) are coordinates of a regular grid on a detection surface comprising the electrodes; (xo(t),yo(t),zo(t)) are 3D coordinates of the end of the object closest to the detection surface; A(zo) and $\sigma$(zo) are two predetermined functions depending on the distance z0 in a monotonic manner, A(z) being decreasing and $\sigma$(zo) increasing.

20. The method according to claim 1, characterized in that the electrodes have non-regular surfaces.

21. An electronic device comprising:
two independent electrodes of a non-optimized shape integrated in a human-machine interface device;
a processing unit for detecting the position of an object by measuring the absolute capacitance of said object with respect to the electrodes, the processing unit is configured to implement at least a method comprising:
a) measuring, for each electrode, an actual value of absolute capacitance between the electrode and the object representative of the object touching or in proximity to the interface device; and
a') calculating a prediction by applying a multi-variable nonlinear prediction model to said actual values of absolute capacitance so as to obtain an image of probability densities, and using said probability densities as corrected absolute capacitance values for the detection of one or more of a location and distance of said object with respect to the interface device, wherein the corrected absolute capacitance values compensate for the non-optimized shape of the at least two independent electrodes.

22. The device according to claim 21, characterized in that the multi-variable nonlinear prediction model is obtained by nonlinear regression on the basis:
of actual values of absolute capacitance obtained for a plurality of object positions with respect to said at least two electrodes; and
of an image of probability densities obtained for a plurality of object positions with respect to idealized electrodes.

23. The device according to claim 21, the method further comprising:
in a) a vector $V_{raw}$ is constituted from the measured absolute capacitance values and the prediction in a') comprises:
b) application of a first non linear transformation F2 to at least the vector $V_{raw}$ in order to obtain a vector X2;
c) application of an affine transformation in order to obtain a vector Y2 by multiplying the vector X2 by a matrix M2 and adding a translation vector Y02; the matrix M2 being a matrix of transfer between a vector of actual values of absolute capacitance obtained on electrodes of non-regular surface in the presence of an object and a vector of virtual values obtained for idealized electrodes in the presence of an object;
d) application to at least the vector Y2 of a second nonlinear transformation which is inverse to the first nonlinear transformation F2 in order to obtain a correction vector V_corr; and
e) use of the correction vector V_corr as values of absolute capacitance for the detection of said object.

24. The device according to claim 21, characterized in that the electrodes are designed on the basis of tin-doped indium oxide.

25. The device according to claim 21, characterized in that the electrodes have non-regular surfaces.

* * * * *